(12) United States Patent
Haag et al.

(10) Patent No.: US 12,411,275 B2
(45) Date of Patent: Sep. 9, 2025

(54) OPTICAL STACK HAVING ABSORBING POLARIZER, HALF-WAVE RETARDER, AND REFLECTIVE POLARIZER

(71) Applicant: 3M INNOVATIVE PROPERTIES COMPANY, St. Paul, MN (US)

(72) Inventors: Adam D. Haag, Woodbury, MN (US); Sun-Yong Park, Gyeonggi-do (KR); Martin E. Denker, Vadnais Heights, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 314 days.

(21) Appl. No.: 18/041,432

(22) PCT Filed: Jul. 29, 2021

(86) PCT No.: PCT/IB2021/056936
§ 371 (c)(1),
(2) Date: Feb. 13, 2023

(87) PCT Pub. No.: WO2022/043791
PCT Pub. Date: Mar. 3, 2022

(65) Prior Publication Data
US 2023/0314683 A1   Oct. 5, 2023

Related U.S. Application Data

(60) Provisional application No. 63/070,486, filed on Aug. 26, 2020.

(51) Int. Cl.
*G02B 5/30* (2006.01)
*G02F 1/1335* (2006.01)
(Continued)

(52) U.S. Cl.
CPC ......... *G02B 5/3083* (2013.01); *G02B 5/3041* (2013.01); *G02B 5/305* (2013.01);
(Continued)

(58) Field of Classification Search
CPC .... G02B 5/3041; G02B 5/305; G02B 5/3083; G02F 1/133536; G02F 1/133638; H10K 50/868
See application file for complete search history.

(56) References Cited

U.S. PATENT DOCUMENTS 10,234,727 B2 * 3/2019 Sakai ................. G02F 1/13363
2017/0052369 A1   2/2017 Shimatani et al.
(Continued)

FOREIGN PATENT DOCUMENTS

| JP | 2000131683 A | 5/2000 |
| JP | 2017068111 A | 4/2017 |
| WO | 2007124315 A2 | 11/2007 |

OTHER PUBLICATIONS

International Search Report for PCT Application No. PCT/IB2021/056936, mailed on Nov. 1, 2021, 4 pages.

*Primary Examiner* — Ryan S Dunning
(74) *Attorney, Agent, or Firm* — Clifton F. Richardson

(57) ABSTRACT

An optical stack includes a reflective polarizer, an absorbing polarizer, and a half-wave retarder. The half-wave retarder is disposed between the reflective and absorbing polarizers. For substantially normally incident light and a first polarization state, the reflective polarizer reflects at least about 60% of the incident light for at least a first wavelength less than a cut-off wavelength and transmits at least about 50% of the incident light for at least a second wavelength greater than the cut-off wavelength. For substantially normally incident light, the half-wave retarder has a first retardance of less than about 250 nanometers (nm) at the first wavelength and a second retardance at the second wavelength. A devia-
(Continued)

tion of the first retardance from a first half-wave retardance corresponding to the first wavelength is less than a deviation of the second retardance from a second half-wave retardance corresponding to the second wavelength.

10 Claims, 10 Drawing Sheets

(51) Int. Cl.
  *G02F 1/13363* (2006.01)
  *H10K 50/80* (2023.01)
(52) U.S. Cl.
  CPC .. *G02F 1/133536* (2013.01); *G02F 1/133638* (2021.01); *H10K 50/868* (2023.02)

(56) References Cited

U.S. PATENT DOCUMENTS

| | | |
|---|---|---|
| 2018/0039131 A1 | 2/2018 | Szwarcman et al. |
| 2019/0004227 A1 | 1/2019 | Park et al. |
| 2020/0012027 A1 | 1/2020 | Jeon et al. |

* cited by examiner

OPTICAL STACK HAVING ABSORBING POLARIZER, HALF-WAVE RETARDER, AND REFLECTIVE POLARIZER

CROSS REFERENCE TO RELATED APPLICATIONS

This application is a national stage filing under 35 U.S.C. 371 of PCT/IB2021/056936, filed Jul. 29, 2021, which claims the benefit of U.S. Application No. 63/070,486, filed Aug. 26, 2020, the disclosures of which are incorporated by reference in their entirety herein.

TECHNICAL FIELD

The present disclosure relates generally to an optical stack, and in particular, to an optical stack for a backlight.

BACKGROUND

In backlights, reflective polarizers are generally used to recycle light, and enhance the ultimate efficiency and brightness of a display. Further, absorbing polarizers or the like are used in conjunction with a liquid crystal module to polarize the light for appropriate modulation by the liquid crystal module. In some manufacturing processes, reflective polarizers in roll form may have a reflection axis (i.e., block axis or slow axis) in a transverse direction (i.e., a width direction of the roll). Absorbing polarizers in roll form may have an absorption axis along a length direction of the roll. In some cases, it may be desirable to align the reflection axis of the reflective polarizer and the absorption axis of the absorbing polarizer within an optical stack. In conventional manufacturing process, one or both of the rolls of polarizers are cut and rotated, adding manufacturing time and process expense.

SUMMARY

In a first aspect, the present disclosure provides an optical stack. The optical stack includes a reflective polarizer, an absorbing polarizer, and a half-wave retarder. The reflective polarizer includes mutually orthogonal transmission and reflection axes. The half-wave retarder is disposed between the reflective and absorbing polarizers. For substantially normally incident light and a first polarization state, the reflective polarizer includes a transmission band with a cut-off wavelength. The reflective polarizer reflects at least about 60% of the incident light for at least a first wavelength less than the cut-off wavelength and transmits at least about 50% of the incident light for at least a second wavelength greater than the cut-off wavelength. For substantially normally incident light and an orthogonal second polarization state, the reflective polarizer transmits at least 70% of the incident light for each of the at least first and second wavelengths. For substantially normally incident light, the half-wave retarder has a first retardance of less than about 250 nanometers (nm) at the first wavelength and a second retardance at the second wavelength. A deviation of the first retardance from a first half-wave retardance corresponding to the first wavelength is less than a deviation of the second retardance from a second half-wave retardance corresponding to the second wavelength. For substantially normally incident light and the first polarization state, the absorbing polarizer has a first transmittance at the first wavelength and a greater second transmittance at the second wavelength.

In a second aspect, the present disclosure provides another optical stack. The optical stack includes a display panel, a reflective polarizer, an absorbing polarizer, and a half-wave retarder. The display panel is configured to emit a display light including a blue emission spectra with a blue full width at half maxima (FWHM) defined between a minimum wavelength and a maximum wavelength. The reflective polarizer is configured to receive and reflect a portion of the display light from the display panel as a reflected polarized light. The reflective polarizer includes mutually orthogonal transmission and reflection axes. The half-wave retarder is disposed between the reflective and absorbing polarizers. For substantially normally incident light and a first polarization state, the reflective polarizer includes a transmission band with a cut-off wavelength greater than the minimum wavelength of the blue emission spectra of the display panel. The reflective polarizer reflects at least about 60% of the incident light for at least a first wavelength less than the cut-off wavelength and transmits at least about 50% of the incident light for at least a second wavelength greater than the cut-off wavelength. For substantially normally incident light and an orthogonal second polarization state, the reflective polarizer transmits at least 70% of the incident light for each of the at least first and second wavelengths. For substantially normally incident light, the half-wave retarder has a first retardance of less than about 250 nm at the first wavelength and a second retardance at the second wavelength. A deviation of the first retardance from a first half-wave retardance corresponding to the first wavelength is less than a deviation of the second retardance from a second half-wave retardance corresponding to the second wavelength. For substantially normally incident light and the first polarization state, the absorbing polarizer has a first transmittance at the first wavelength and a greater second transmittance at the second wavelength.

BRIEF DESCRIPTION OF THE DRAWINGS

Exemplary embodiments disclosed herein may be more completely understood in consideration of the following detailed description in connection with the following figures. The figures are not necessarily drawn to scale. Like numbers used in the figures refer to like components. However, it will be understood that the use of a number to refer to a component in a given figure is not intended to limit the component in another figure labeled with the same number.

DETAILED DESCRIPTION

Figure 1:
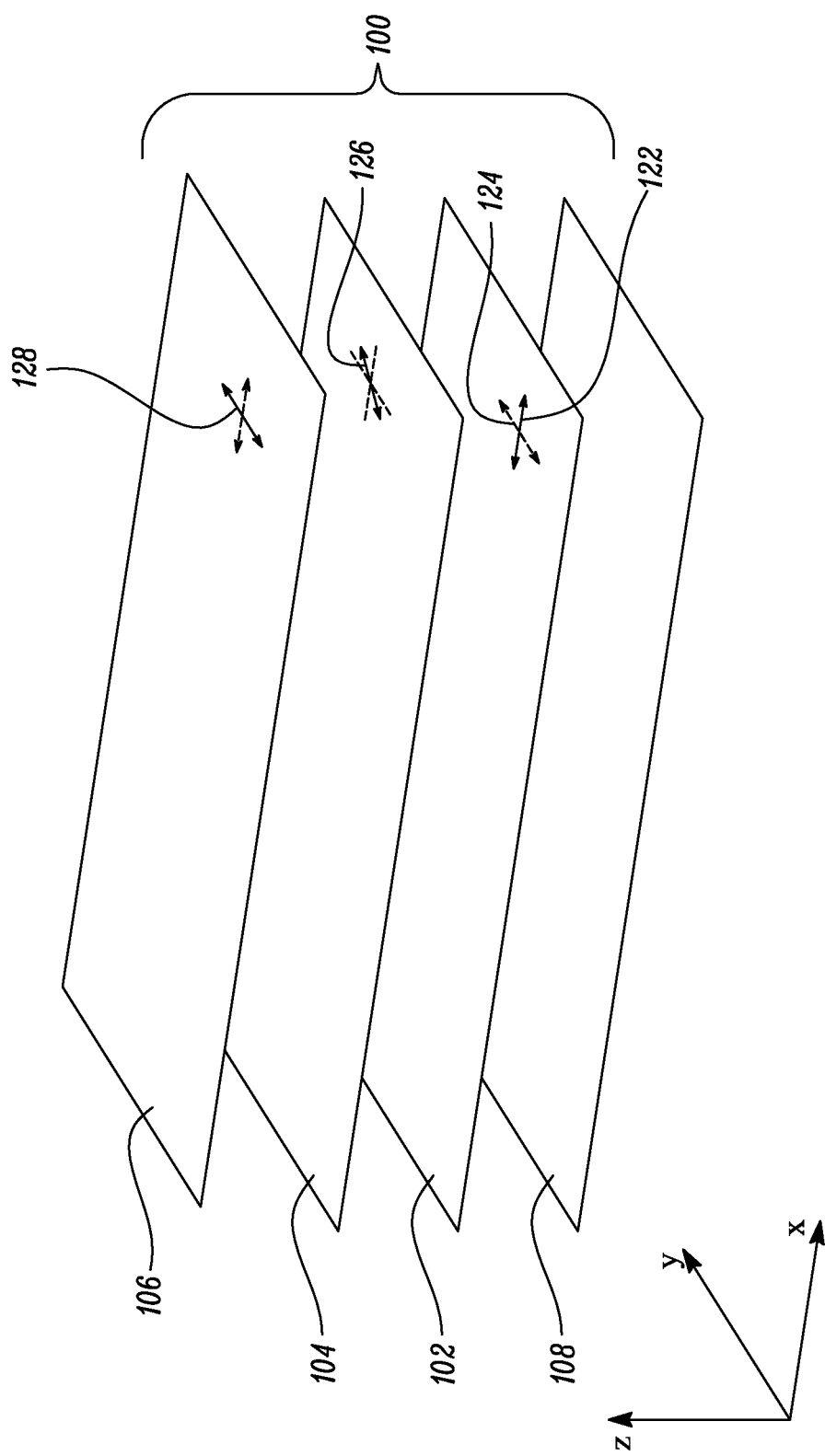
FIG. 1 is a schematic exploded top perspective view of an optical stack according to one embodiment of the present disclosure.

In the following description, reference is made to the accompanying figures that form a part thereof and in which various embodiments are shown by way of illustration. It is to be understood that other embodiments are contemplated and may be made without departing from the scope or spirit of the present disclosure. The following detailed description, therefore, is not to be taken in a limiting sense.

The present disclosure relates to an optical stack. The optical stack may be used in a backlight of electronic devices that incorporate displays, such as computer monitors, televisions, mobile phones, personal digital assistants (PDAs), wearable devices and other portable devices. A typical optical stack includes a reflective polarizer and an absorbing polarizer.

In conventional manufacturing processes and with conventional material selections, a reflective polarizer is stretched such that a reflection axis (the axis parallel to a polarization state preferentially reflected by the reflective polarizer) is along a width direction of the reflective polarizer. Further, a conventional absorbing polarizer is usually aligned in the machine direction, resulting in an absorption axis being substantially along a length of the absorbing polarizer. Thus, conventional manufacturing processes result in rolls of the reflective polarizer and the absorbing polarizer having transmission axes oriented orthogonally to one another. Therefore, costly converting steps may be needed in order to provide a sheet having an absorbing polarizer and a reflective polarizer with their transmission axes aligned. Generally, in a sheet to roll lamination process, the reflective polarizer is cut and rotated 90 degrees in order to align the transmission axes. This process is time consuming and expensive, and sometimes the converting steps may also increase the chance of introducing defects, which can lower the yield or usable portion of the optical stack. Therefore, it may be desirable to align the reflection axis of the reflective polarizer and the absorption axis of the absorbing polarizer within an optical stack to save additional manufacturing time and process expense.

In some designs, a half-wave retarder is disposed between the reflective polarizer and the absorbing polarizer. The half-wave retarder may have a slow axis oriented substantially 45 degrees to a transmission axis of the reflective polarizer. The half-wave retarder may rotate linearly polarized light 90 degrees between the reflective polarizer and the absorbing polarizer to align the reflection axis of the reflective polarizer and the absorption axis of the absorbing polarizer. However, incorporation of the half-wave retarder may pose a challenge to rotate the linearly polarized light evenly for all visible wavelengths to minimize color shifts, or other artifacts at various viewing angles in the optical stack. The color shifts may be due to non-linear wavelength-dependent modulation of light in a conventional half-wave retarder. In some of these cases, specialized materials are used to make achromatic half-wave retarders to reduce the color shifts. However, even an achromatic half-wave retarder may display some chromatic differences in conversion of linearly polarized light. Further, utilizing achromatic half-wave retarders may also significantly increase the overall cost of the optical stack.

The present disclosure relates to an optical stack including a reflective polarizer, an absorbing polarizer, and a half-wave retarder. The reflective polarizer of the present disclosure has mutually orthogonal transmission and reflection axes. The half-wave retarder is disposed between the reflective and absorbing polarizers. For substantially normally incident light and a first polarization state, the reflective polarizer of the present disclosure includes a transmission band with a cut-off wavelength. For the first polarization state, the reflective polarizer reflects at least about 60% of the incident light for at least a first wavelength less than the cut-off wavelength, and transmits at least about 50% of the incident light for at least a second wavelength greater than the cut-off wavelength. For substantially normally incident light and an orthogonal second polarization state, the reflective polarizer transmits at least 70% of the incident light for each of the at least first and second wavelengths.

Furthermore, the half-wave retarder of the present disclosure is designed in such a way that, for substantially normally incident light, the half-wave retarder has a first retardance of less than about 250 nanometers (nm) at the first wavelength and a second retardance at the second wavelength. A deviation of the first retardance from a first half-wave retardance corresponding to the first wavelength is less than a deviation of the second retardance from a second half-wave retardance corresponding to the second wavelength.

Such optimization of the half-wave retarder in the wavelengths less than the cut-off wavelength of the transmission band of the reflective polarizer may reduce optical artifacts, such as color shifts. Specifically, the combination of the reflective polarizer and the half-wave retarder of the present disclosure may exhibit an improved performance in reducing the color shifts. Further, a half-wave retarder optimized in such a manner may be easier and cheaper to produce as compared to conventional achromatic half-wave retarders.

Figure 2:
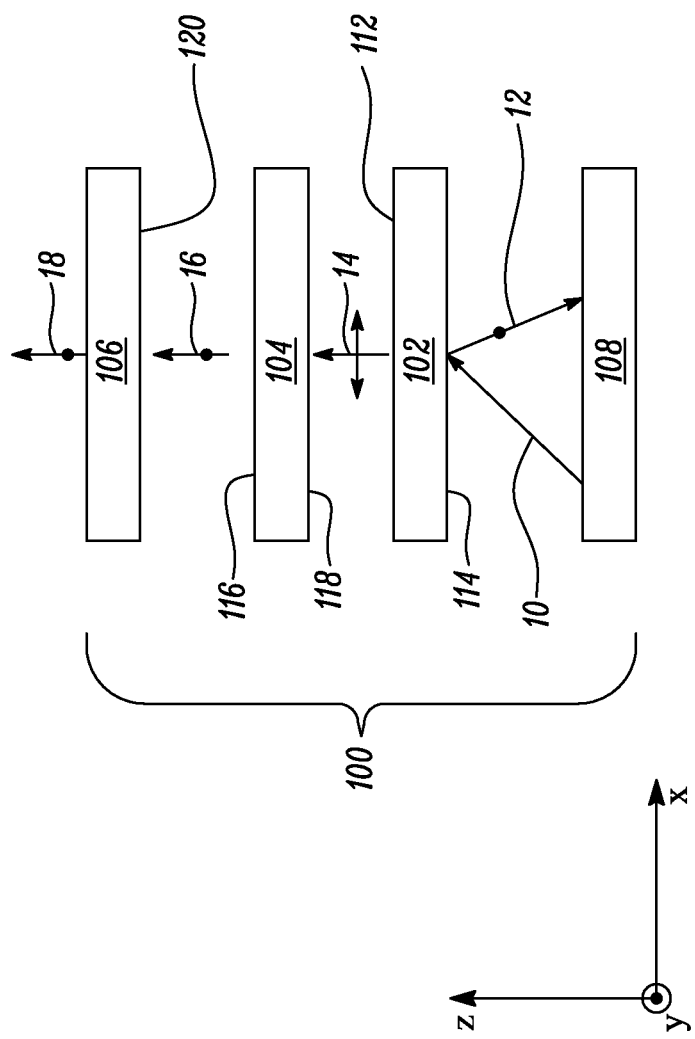
FIG. 2 is a schematic exploded front elevation view of the optical stack of FIG. 1.

Referring now to FIGS. 1 and 2, an optical stack 100 is illustrated according to an embodiment of the present disclosure. The optical stack 100 includes a reflective polarizer 102, a half-wave retarder 104, an absorbing polarizer 106, and a display panel 108. In some embodiments, the reflective polarizer 102, the half-wave retarder 104, the absorbing polarizer 106, and the display panel 108 are substantially co-extensive with each other, or of same in-plane dimensions (i.e., length and width).

The optical stack 100 defines mutually orthogonal x, y, and z-axes. The x and y-axes are in-plane axes of the optical stack 100, while the z-axis is a transverse axis disposed along a thickness of the optical stack 100. In other words, the x and y-axes are disposed along a plane of the optical stack 100, while the z-axis is perpendicular to the plane of the optical stack 100. The reflective polarizer 102, the half-wave retarder 104, the absorbing polarizer 106, and the display panel 108 are disposed adjacent to each other along the z-axis of the optical stack 100.

In some embodiments, the reflective polarizer 102, the half-wave retarder 104, and the absorbing polarizer 106 of the optical stack 100 may be in optical contact with one another. In some embodiments, the reflective polarizer 102, the half-wave retarder 104, and the absorbing polarizer 106 of the optical stack 100 are attached with one or more of a pressure sensitive adhesive, an optically clear adhesive, an Ultraviolet (UV) curable adhesive, or a polyvinyl alcohol type adhesive, laminations, or any other attachment mechanisms.

The reflective polarizer 102 includes mutually orthogonal transmission and reflection axes 122, 124. The reflective polarizer 102 may be a notched reflective polarizer having one or more notches or bands. The reflective polarizer 102 may be any suitable reflective polarizer, including a wire-grid polarizer or a multilayer birefringent reflective polarizer. In the illustrated embodiment, the reflective polarizer 102 may have the transmission axis 122 generally along the x-axis of the reflective polarizer and the reflection axis 124 generally along the y-axis. The reflective polarizer 102 further includes a first major surface 112 and a second major surface 114 opposite to the first major surface 112. In some embodiments, each of the first and second major surfaces 112, 114 of the reflective polarizer 102 may be substantially planar and disposed along the x-y plane.

The half-wave retarder 104 is disposed between the reflective and absorbing polarizers 102, 106. The half-wave retarder 104 includes a first major surface 116 and a second major surface 118 opposite to the first major surface 116. In some embodiments, each of the first and second major surfaces 116, 118 of the half-wave retarder 104 may be substantially planar and disposed along the x-y plane. In the illustrated embodiment of FIG. 2, the absorbing polarizer 106 is disposed adjacent to the first major surface 116 of the half-wave retarder 104. Further, the second major surface 118 of the half-wave retarder 104 is disposed adjacent to the first major surface 112 the reflective polarizer 102. Generally, the half-wave retarder 104 includes a layer of a birefringent material. In some embodiments, the half-wave retarder 104 includes a half-wave cyclo-olefin polymer (COP) retarder. In some embodiments, the half-wave retarder 104 may include two layers of birefringent material. In some embodiments, the half-wave retarder 104 may be a blend of two materials, i.e., a positive birefringent material and a negative birefringent material. In some embodiments, the half-wave retarder 104 may include two layers such that one of the layers may rotate linearly polarized light by substantially 15 degrees, and another layer may rotate linearly polarized light by substantially 75 degrees. In some embodiments, the half-wave retarder 104 is a non-achromatic half-wave retarder, i.e., a retardance of the half-wave retarder 104 substantially deviates from an ideal half-wave retardance across at least a portion of a visible wavelength range. Generally, a deviation of the retardance of the achromatic half-wave retarder from the retardance of an ideal half-wave retarder is less than a deviation of the retardance of the non-achromatic retarder from the retardance of the ideal half-wave retarder. Further, the retardance of the non-achromatic half-wave retarder is generally same or less at higher wavelengths as compared to the retardance at lower wavelengths. On the other hand, the retardance of the achromatic half-wave retarder generally increases at the higher wavelengths.

The half-wave retarder 104 includes a slow axis 126 oriented substantially 45 degrees with respect to the transmission axis 122 of the reflective polarizer 102. For the purposes of this application, an orientation of substantially 45 degrees and substantially 135 degrees may be considered substantially equivalent, given the bidirectional nature of the transmission axis 122. Substantially 45 degrees also may be understood to not be limited to precisely 45 degrees, instead, the alignment of the axes may be within 10 degrees, within 5 degrees, or within 1 degrees of 45 degrees. Alignment may in some cases be a tradeoff between manufacturability (e.g., error tolerance) and optical performance, the appropriate balance being determined depending on the application attributes.

The display panel 108 is disposed below the reflective polarizer 102 opposite to the half-wave retarder 104. In the illustrated embodiment of FIG. 2, the display panel 108 is disposed adjacent to the second major surface 114 of the reflective polarizer 102. In some embodiments, the display panel 108 includes an organic light emitting diode (OLED) display panel. In some embodiments, a quarter-wave retarder (not shown) may be disposed between the reflective polarizer 102 and the display panel 108. The quarter-wave retarder may be used to produce circular polarization in order to reduce ambient reflection from the display panel 108. In some other embodiments, the display panel 108 includes a liquid crystal display (LCD) panel.

The absorbing polarizer 106 may be disposed on the half-wave retarder 104 opposite to the reflective polarizer 102. In the illustrated embodiment of FIG. 2, a bottom surface 120 of the absorbing polarizer 106 is disposed on the first major surface 116 of the half-wave retarder 104. The absorbing polarizer 106 includes a transmission axis 128 oriented substantially 90 degrees with respect to the transmission axis 122 of the reflective polarizer 102, and substantially 45 degrees (or 135 degrees) with respect to the slow axis 126 of the half-wave retarder 104. In the illustrated embodiment, the transmission axis 128 of the absorbing polarizer 106 is disposed generally along the y-axis. The absorbing polarizer 106 may include any suitable material, such as a polymeric material. In some embodiments, the absorbing polarizer 106 may include polyvinyl alcohol. In some embodiments, the absorbing polarizer 106 may include polarizing elements, including polarizing or dichroic dyes.

In some embodiments, the optical stack 100 may include additional or intermediate films, layers, or components, such as, diffusing layers, turning layers, or substrate layers. The optical stack 100 may, in total, be of any suitable thickness based on desired application attributes.

The display panel 108 is configured to emit a display light 10. The reflective polarizer 102 is configured to receive and reflect a portion of the display light 10 from the display panel 108 as a reflected polarized light 12. The display light 10 is generally unpolarized. However, in some cases, the display light 10 may be at least partially polarized light. For the purpose of explanation, the display light 10 may be treated as light having an unknown or arbitrary polarization state or distribution of polarization states. The reflected polarized light 12 is generally polarized along the reflection axis 124 (i.e., y-axis) of the reflective polarizer 102. The reflected polarized light 12 may therefore have a first polarization state along the y-axis. The reflective polarizer 102 transmits a first transmitted light 14 having an orthogonal second polarization state parallel to the transmission axis 122 (i.e., x-axis) of the reflective polarizer 102.

The half-wave retarder 104 receives the first transmitted light 14 from the reflective polarizer 102. The half-wave retarder 104 is configured to rotate or modulate at least a portion of the polarization of first transmitted polarized light 14 to orthogonally polarized second transmitted light 16. The second transmitted light 16 may therefore have the first polarization state. The absorbing polarizer 106 receives the second transmitted light 16 from the half-wave retarder 104 and emits at least a portion of the second transmitted light 16 as an output light 18 having the first polarization state.

Figure 4:
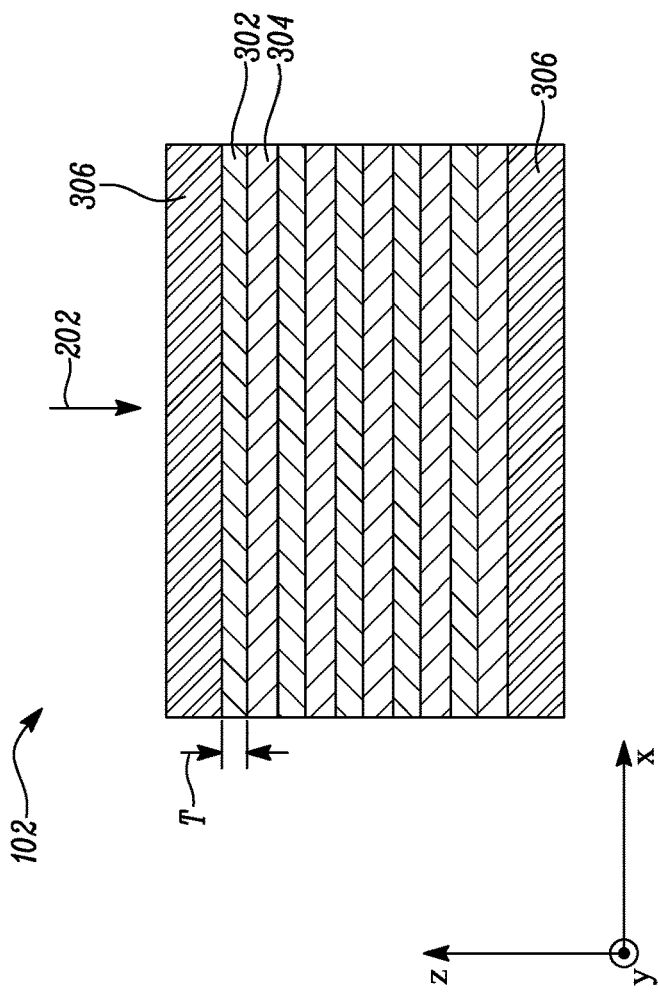
FIG. 4 is a detailed schematic view of the reflective polarizer according to one embodiment of the present disclosure.
Figure 3:
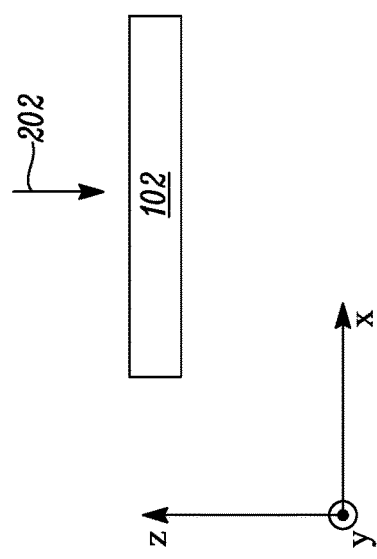
FIG. 3 is a schematic view of a half-wave retarder of the optical stack according to one embodiment of the present disclosure.

FIGS. 3 and 4 illustrate the reflective polarizer 102. The reflective polarizer 102 may include one or more of a polymeric reflective polarizer, a wire grid reflective polarizer, and a diffuse reflective polarizer. As illustrated in FIG. 4, the reflective polarizer 102 includes a plurality of alternating first and second polymeric layers 302, 304. In some embodiments, the plurality of alternating first and second polymeric layers 302, 304 number at least 40 in total. In some other embodiments, the plurality of alternating first and second polymeric layers 302, 304 number at least 50, at least 75, at least 90, at least 95, or at least 100 in total. Each of the first and second polymeric layers 302, 304 defines an average thickness "T" along the z-axis. In some embodiments, each of the first and second polymeric layers 302, 304 has the average thickness "T" of less than about 350 nm. In some embodiments, each of the first and second polymeric layers 302, 304 may have the average thickness "T" less than about 400 nm. In some other embodiments, the average thickness "T" of each of the first and second polymeric layers 302, 304 may be less than about 500 nm, less than about 600, or less than about 700 nm. In some embodiments, the reflective polarizer 102 may further include a protective layer 306 disposed on each major side of the plurality of alternating first and second polymeric layers 302, 304.

Figure 5:
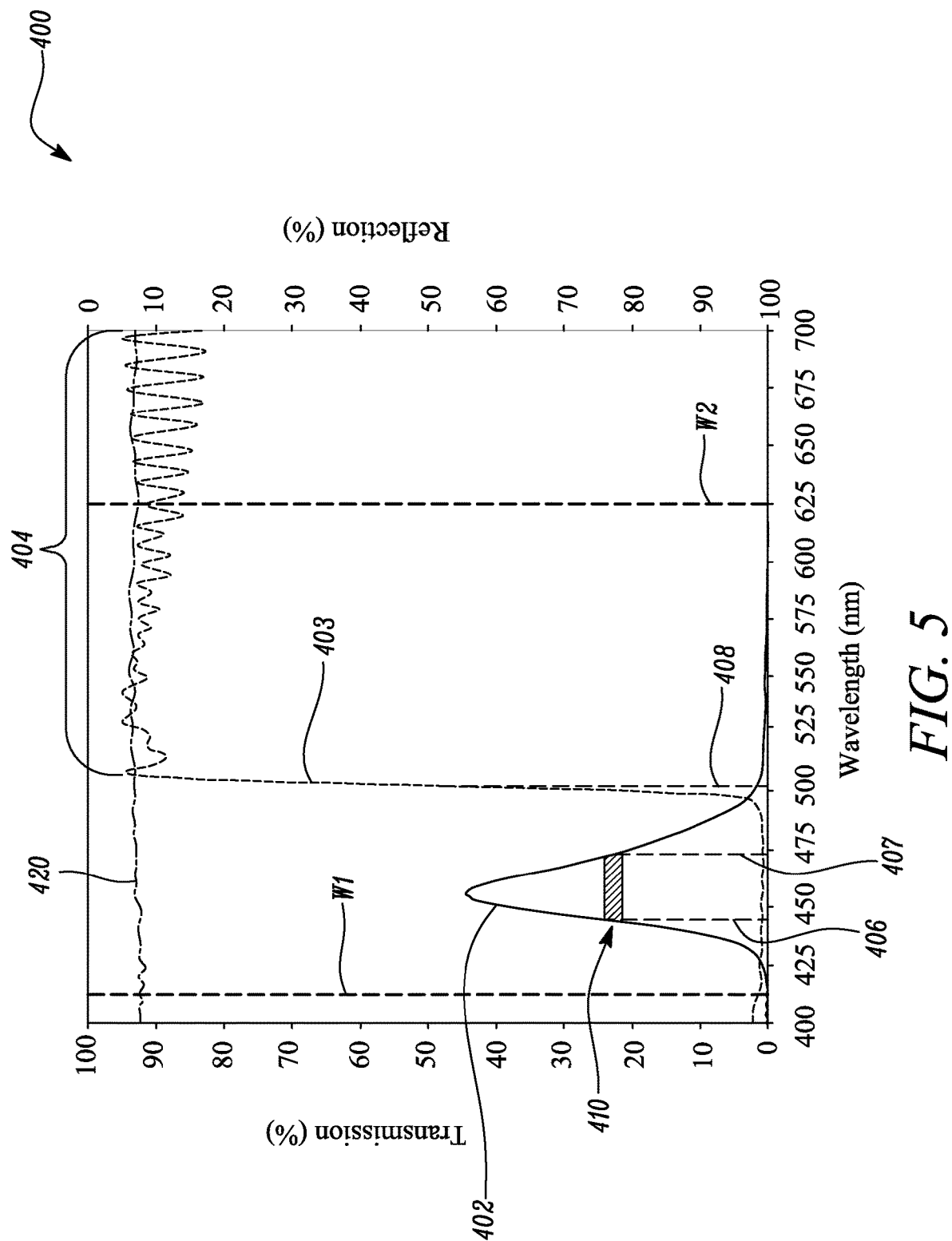
FIG. 5 is a graph illustrating transmission versus wavelength for the reflective polarizer having a transmission band according to one embodiment of the present disclosure.
Figure 6:
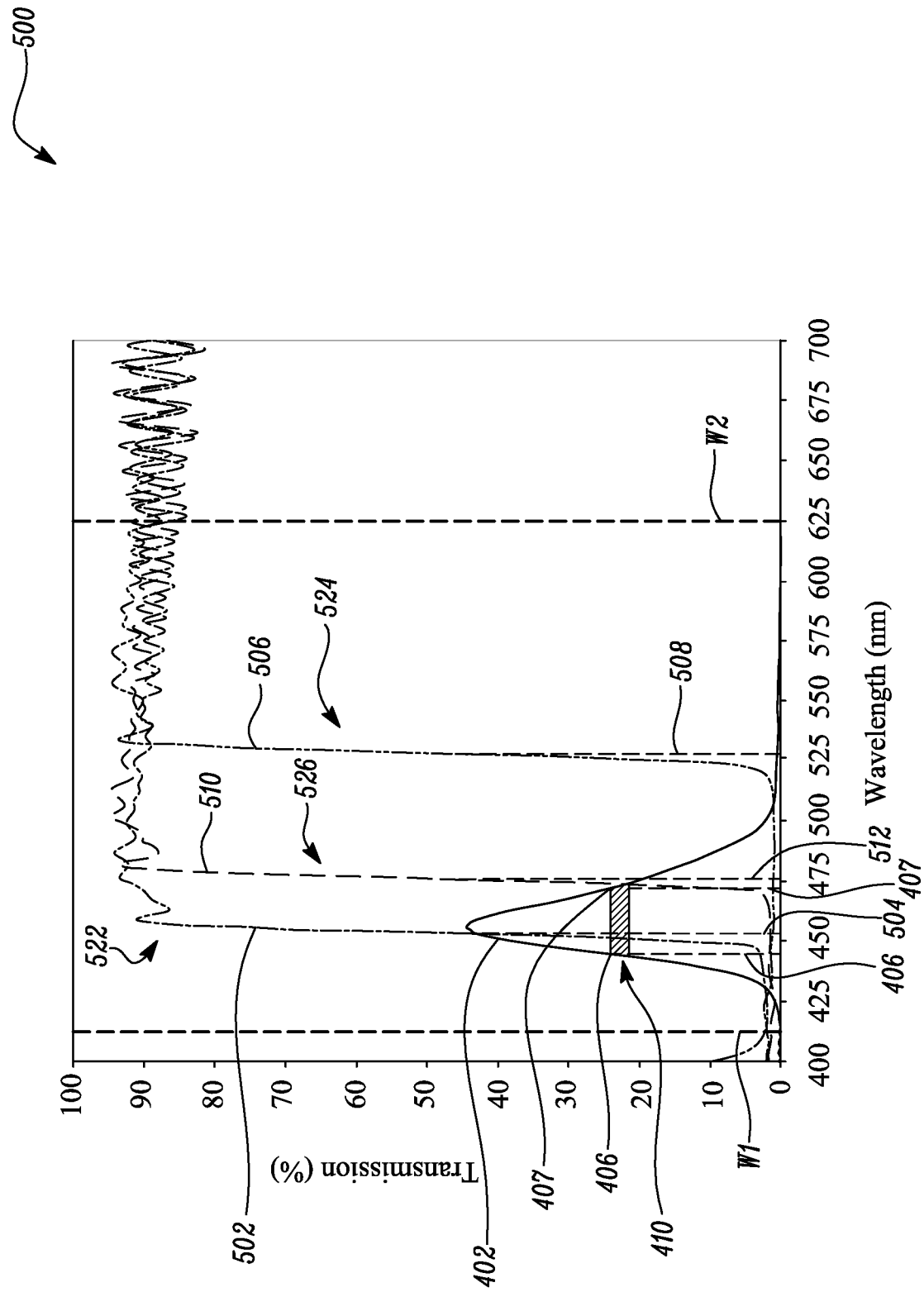
FIG. 6 is another graph illustrating transmission versus wavelength for the reflective polarizers having other transmission bands according to another embodiment of the present disclosure.

FIGS. 5 and 6 illustrate exemplary graphs 400, 500, respectively. The graphs 400, 500 depict transmission percentage versus wavelength for different transmission bands of the reflective polarizer 102. Wavelength is expressed in nanometers (nm) across the visible wavelength range. In FIGS. 5 and 6, transmittance is expressed as transmission percentage in the left ordinate. In FIG. 5, reflectance is expressed as reflection percentage in the right ordinate. The reflection percentage is complementary to the transmission percentage, i.e., reflection percentage=(100−transmission percentage).

Referring to FIGS. 1, 5 and 6, the display panel 108 is configured to emit the display light 10 including a blue emission spectra 402 with a blue full width at half maxima (FWHM) 410 defined between a minimum wavelength 406 and a maximum wavelength 407. Any suitable energy unit may be used to illustrate the blue emission spectra 402 of the display panel 108 in the graphs 400, 500. In some embodiments, the minimum wavelength 406 is greater than about 430 nm and the maximum wavelength 407 is less than about 480 nm. In some other embodiments, the minimum wavelength 406 may be greater than about 400 nm and the maximum wavelength 407 may be less than about 500 nm.

Referring to FIGS. 3, 4 and 5, for substantially normally incident light 202, and the first polarization state, the reflective polarizer 102 includes a transmission band 404 with a cut-off wavelength 408. Specifically, for the substantially normally incident light 202 and the first polarization state, the reflective polarizer 102 includes a transmission spectrum 403 including the transmission band 404 with the cut-off wavelength 408. The minimum wavelength 406 is less than the cut-off wavelength 408 of the transmission band 404 of the reflective polarizer 102. In other words, the reflective polarizer 102 includes the transmission band 404 with the cut-off wavelength 408 greater than the minimum wavelength 406 of the blue emission spectra 402 of the display panel 108. In the illustrated embodiment of FIG. 5, the maximum wavelength 407 is also less than the cut-off wavelength 408 of the transmission band 404 of the reflective polarizer 102. In other words, the cut-off wavelength 408 of the transmission band 404 of the reflective polarizer 102 is greater than the maximum wavelength 407 of the blue FWHM 410 of the display panel 108.

The cut-off wavelength 408 may correspond to a wavelength at which transmittance is half (50%) of a peak or a maximum transmittance. The cut-off wavelength 408 of the transmission band 404 of the reflective polarizer 102 is greater than about 500 nm. In some other embodiments, the cut-off wavelength 408 of the transmission band 404 of the reflective polarizer 102 is greater than about 525 nm. In some other embodiments, the cut-off wavelength 408 of the transmission band 404 of the reflective polarizer 102 is less than about 550 nm.

For the first polarization state, the reflective polarizer 102 reflects at least about 60% of the incident light 202 for at least a first wavelength W1 less than the cut-off wavelength 408 and transmits at least about 50% of the incident light 202 for at least a second wavelength W2 greater than the cut-off wavelength 408. In some other embodiments, for the first polarization state, the reflective polarizer 102 reflects at least about 70%, at least about 80%, at least about 90%, at least about 95%, or at least about 99% of the incident light 202 for at least the first wavelength W1 less than the cut-off wavelength 408. In some embodiments, for the first polarization state, the reflective polarizer 102 transmits at least about 55%, at least about 60%, at least about 70%, at least about 80%, or at least about 90% of the incident light 202 for at least the second wavelength W2 greater than the cut-off wavelength 408. The first wavelength W1 lies in a blue wavelength range. Therefore, for the first polarization state, the reflective polarizer 102 reflects at least a portion of the wavelengths in the blue wavelength range. In some embodiments, the first wavelength W1 lies in a range from about 400 nm to about 500 nm. In the illustrated embodiment, the first wavelength W1 is less than the minimum wavelength 406. In some other embodiments, the first wavelength W1 may be between the minimum wavelength 406 and the maximum wavelength 407. The second wavelength W2 may lie in a red wavelength range. In some embodiments, the second wavelength W2 lies in a range from about 600 nm to about 700 nm. In some embodiments, for the first polarization state, the reflective polarizer 102 may reflect at least about 60% of the incident light 202 for one or more wavelengths in the blue wavelength range and may transmit at least about 50% of the incident light 202 for each wavelength in subsequent wavelength ranges, such as a green wavelength range and the red wavelength range.

For the substantially normally incident light 202, and the second polarization state, the reflective polarizer 102 transmits at least 70% of the incident light 202 for each of the at least first and second wavelengths W1, W2. In some embodiments, for the second polarization state, the reflective polarizer 102 transmits at least about 80%, at least about 85%, or at least about 90% of the incident light 202 for each of the at least first and second wavelengths W1, W2. As shown in FIG. 5, for the substantially normally incident light 202, and the second polarization state, the reflective polarizer 102 includes a transmission spectrum 420. In some embodiments, for the second polarization state, the reflective polarizer 102 may transmit at least 70% of the incident light 202 for each wavelength in a visible wavelength range from about 400 nm to about 700 nm. In some other embodiments, for the second polarization state, the reflective polarizer 102 may transmit at least 80%, at least 85%, or at least 90% of the incident light 202 for each wavelength in the visible wavelength range.

In some embodiments, the first polarization state is S polarization state and the second polarization state is P polarization state. In some other embodiments, the first polarization state is P polarization state and the second polarization state is S polarization state. The first polarization state is generally along the y-axis, while the second polarization state is generally along the x-axis.

Referring to FIGS. 3, 4 and 6, for the substantially normally incident light 202, and the first polarization state, the reflective polarizer 102 includes any one of transmission bands 502, 506, 510. The transmission bands 502, 506, 510 correspond to transmission spectra 522, 524, 526, respectively, for the substantially normally incident light 202, and the first polarization state. The transmission spectrum 420 (shown in FIG. 5) for the substantially normally incident light 202 and the second polarization state may correspond to each of the transmission spectra 522, 524, 526 for the first polarization state.

The transmission band 502 has a cut-off wavelength 504. The transmission band 506 has a cut-off wavelength 508. The transmission band 510 has a cut-off wavelength 512. The minimum wavelength 406 is less than each of the cut-off wavelengths 504, 508, 512 of the respective transmission bands 502, 506, 510. In other words, the cut-off wavelengths 504, 508, 512 of the respective transmission bands 502, 506, 510 are greater than the minimum wavelength 406 of the blue FWHM 410 of the display panel 108. In the illustrated embodiment of FIG. 6, the maximum wavelength 407 is less than each of the cut-off wavelengths 508, 512 of the respective transmission bands 506, 510. In other words, the cut-off wavelengths 508, 512 of the transmission bands 506, 510 are greater than the maximum wavelength 407 of the blue FWHM 410 of the display panel 108. However, the cut-off wavelength 504 of the transmission band 502 is less than the maximum wavelength 407 of the blue FWHM 410 of the display panel 108. The cut-off wavelength 504 of the transmission band 502 is therefore greater than the minimum wavelength 406 and less than the maximum wavelength 407. In some embodiments, the cut-off wavelength 504 of the transmission band 502 of the reflective polarizer 102 is about 450 nm. In some embodiments, the cut-off wavelength 504 of the transmission band 502 of the reflective polarizer 102 is greater than about 425 nm and less than about 475 nm. In some other embodiments, the cut-off wavelength 504 of the transmission band 502 of the reflective polarizer 102 is greater than about 470 nm. In some embodiments, the cut-off wavelength 508 of the transmission band 506 of the reflective polarizer 102 is about 525 nm. In some embodiments, the cut-off wavelength 508 of the transmission band 506 of the reflective polarizer 102 is greater than about 500 nm and less than about 550 nm. In some embodiments, the cut-off wavelength 512 of the transmission band 510 of the reflective polarizer 102 is about 475 nm. In some other embodiments, the cut-off wavelength 512 of the transmission band 510 of the reflective polarizer 102 is greater than about 450 nm and less than about 500 nm.

For the first polarization state, the reflective polarizer 102 reflects at least about 60% of the incident light 202 for at least the first wavelength W1 less than each of the cut-off wavelengths 504, 508, 512 and transmits at least about 50% of the incident light 202 for at least the second wavelength W2 greater than each of the cut-off wavelengths 504, 508, 512. In some other embodiments, for the first polarization state, the reflective polarizer 102 reflects at least about 70%, at least about 80%, at least about 90%, at least about 95%, or at least about 99% of the incident light 202 for at least the first wavelength W1 less than each of the cut-off wavelengths 504, 508, 512. In some embodiments, for the first polarization state, the reflective polarizer 102 transmits at least about 50%, at least about 60%, at least about 70%, at least about 80%, or at least about 90% of the incident light 202 for at least the second wavelength W2 greater than the each of the cut-off wavelengths 504, 508, 512. The first wavelength W1 lies in the blue wavelength range. Therefore, for the first polarization state, the reflective polarizer 102 reflects a portion of the wavelengths in the blue wavelength range.

For substantially normally incident light 202, and the second polarization state, the reflective polarizer 102 transmits at least 70% of the incident light 202 for each of the at least first and second wavelengths W1, W2. In some other embodiments, for the second polarization state, the reflective polarizer 102 transmits at least about 80%, at least about 85%, or at least about 90% of the incident light 202 for each of the at least first and second wavelengths W1, W2.

Figure 7:
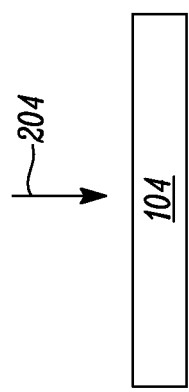
FIG. 7 is a schematic view of a half-wave retarder of the optical stack according to one embodiment of the present disclosure.
Figure 7:
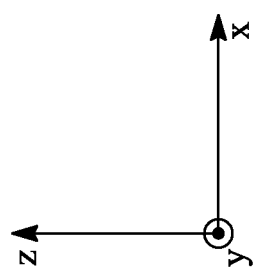
Figure 8:
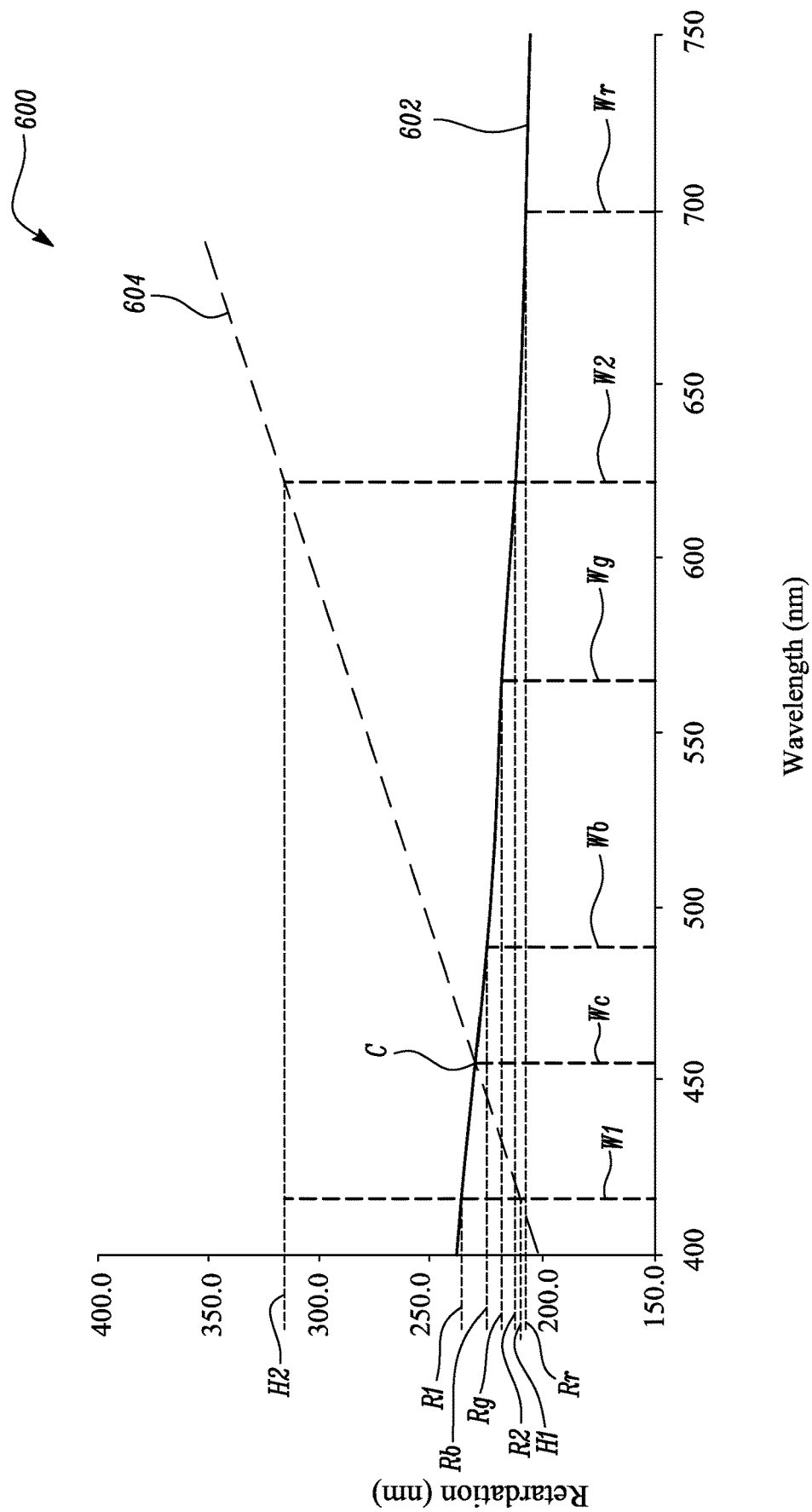
FIG. 8 is a graph illustrating retardation versus wavelength for the half-wave retarder according to one embodiment of the present disclosure.

FIG. 7 illustrates the half-wave retarder 104. FIG. 8 is a graph 600 illustrating retardation versus wavelength for the half-wave retarder 104 according to one embodiment of the present disclosure. The graph 600 includes a retardation curve 602 which depicts retardation of the half-wave retarder 104 at various wavelengths.

Referring to FIGS. 7 and 8, for substantially normally incident light 204, the half-wave retarder 104 has a first retardance R1 of less than about 250 nm at the first wavelength W1 and a second retardance R2 at the second wavelength W2. In some embodiments, the second retardance R2 is greater than about 200 nm. In some embodiments, the second retardance R2 is less than the first retardance R1. In other words, the second retardance R2 is less than about 250 nm.

Furthermore, as shown in FIG. 8, the half-wave retarder 104 has a minimum blue retardance Rb at a corresponding blue wavelength Wb, a minimum green retardance Rg at a corresponding green wavelength Wg, and a minimum red retardance Rr at a corresponding red wavelength Wr. The minimum blue, green, and red retardances Rb, Rg, Rr are within 20% of range of each other. In some other embodiments, the minimum blue, green, and red retardances Rb, Rg, Rr are within 15% of range of each other. As illustrated in FIG. 8, the minimum blue, green, and red retardances Rb, Rg, Rr are less than 250 nm. In some embodiments, the second retardance R2 is less than the minimum blue and green retardances Rb, Rg. In some embodiments, the second retardance R2 is greater than the minimum red retardance Rr. In some embodiments, the first retardance R1 is greater than the minimum blue, green, and red retardances Rb, Rg, Rr. It may be apparent from the graph 600 that the retardance of the half-wave retarder 104 does not vary considerably with the wavelength of the incident light 204. The half-wave retarder 104 is therefore a non-achromatic half-wave retarder.

Referring to FIG. 8, a half-wave curve 604 denotes a variation of retardance with wavelength for an ideal half-wave retarder. In other words, a retardance at each point on the half-wave curve 604 is half of the corresponding wavelength (i.e., Retardance=Wavelength/2). The half-wave curve 604 intersects the retardation curve 602 of the half-wave retarder 104 at only one point C. Therefore, the half-wave retarder 104 has an ideal half-wave retardance at only one wavelength Wc corresponding to the point C. The wavelength Wc may be about 450 nm. Otherwise, the retardance curve 602 deviates from the half-wave curve 604 at all other wavelengths. Further, the retardance curve 602 generally decreases with an increase in wavelength, while the half-wave curve 604 increases with an increase in wavelength. The half-wave curve 604 has a first half-wave retardance H1 at the first wavelength W1 (i.e., H1=W1/2). Further, the half-wave curve 604 has a second half-wave retardance H2 at the second wavelength W2 (i.e., H2=W2/2).

Figure 9:
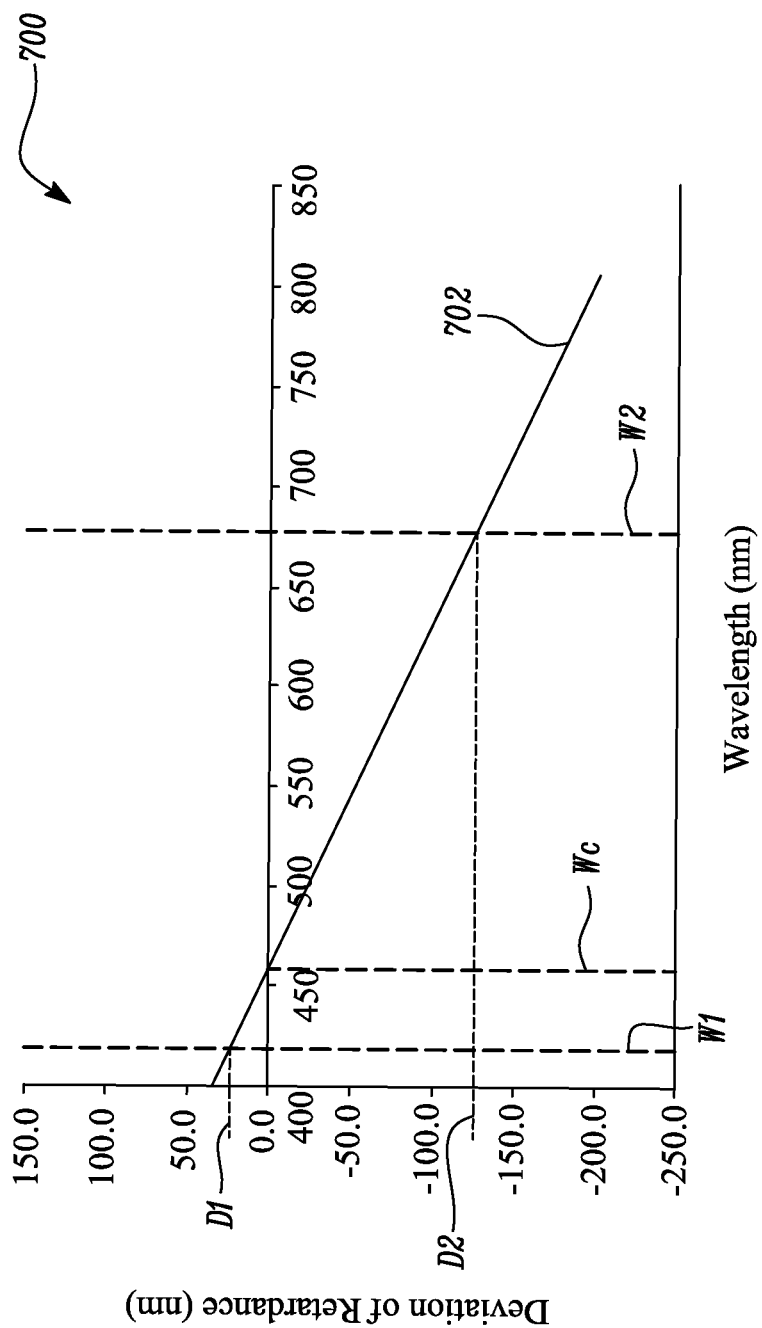
FIG. 9 is a graph illustrating deviation of retardance versus wavelength for the half-wave retarder according to one embodiment of the present disclosure.

FIG. 9 is a graph 700 illustrating deviation of retardance versus wavelength for the half-wave retarder 104. The graph 700 includes a retardance deviation curve 702 which depicts deviation of retardance of the half-wave retarder 104 at various wavelengths.

Referring to FIGS. 8 and 9, the retardance deviation curve 702 illustrates a deviation of the retardance curve 602 of the half-wave retarder 104 from the half-wave curve 604. A deviation D1 of the first retardance R1 from the first half-wave retardance H1 corresponding to the first wavelength W1 is less than a deviation D2 of the second retardance R2 from the second half-wave retardance H2 corresponding to the second wavelength W2. The first half-wave retardance H1 corresponding to the first wavelength W1 may be considered as an ideal retardance of the half-wave retarder 104 at the first wavelength W1. Similarly, the second half-wave retardance H2 corresponding to the second wavelength W2 may be considered as an ideal retardance of the half-wave retarder 104 at the second wavelength W2. It may be apparent from the graph 700 that a deviation of the retardance of the half-wave retarder 104 from the half-wave curve 604 for a wavelength range from about 400 nm to about 500 nm is lower than a deviation for wavelengths greater than 500 nm (for example, in the red wavelength range). The wavelength range from about 400 nm to about 500 nm may correspond to the blue wavelength range. Therefore, the half-wave retarder 104 may be optimized for the blue wavelength range. In other words, the half-wave retarder 104 may behave closer to an ideal half-wave retarder within the wavelength range from about 400 nm to about 500 nm as compared to other wavelengths.

As described above with respect to FIGS. 3, 5 and 6, for substantially normally incident light 202 and the first polarization state, the reflective polarizer 102 reflects at least about 60% of the incident light 202 for at least the first wavelength W1 less than each of the cut-off wavelengths 408, 504, 508, 512 of the respective transmission bands 404, 502, 506, 510, and transmits at least about 50% of the incident light 202 for at least the second wavelength W2 greater than each of the cut-off wavelengths 408, 504, 508, 512 of the respective transmission bands 404, 502, 506, 510. For substantially normally incident light 204, the half-wave retarder 104 has the first retardance R1 of less than about 250 nm at the first wavelength W1 and the second retardance R2 at the second wavelength W2. The second retardance R2 is less than the first retardance R1. Further, the deviation D1 of the first retardance R1 from the first half-wave retardance H1 corresponding to the first wavelength W1 is less than the deviation D2 of the second retardance R2 from the second half-wave retardance H2 corresponding to the second wavelength W2.

Such optimization of the half-wave retarder 104 in the wavelengths less than the cut-off wavelengths 408, 504, 508, 512 of the respective transmission bands 404, 502, 506, 510 may reduce color shifts during operation of the optical stack 100 of FIGS. 1 and 2. Specifically, using the half-wave retarder 104 optimized in the blue wavelength range with the reflective polarizer 102 having the cut-off wavelengths 408, 504, 508, 512 of the respective transmission bands 404, 502, 506, 510 in or near the blue wavelength range may reduce the color shifts. The combination of the reflective polarizer 102 and the half-wave retarder 104 may therefore exhibit an improved performance in reducing the color shifts. Further, a half-wave retarder optimized in such a manner may be easier and cheaper to manufacture as compared to conventional achromatic half-wave retarders having multiple layers. It may be noted that any one of the possible transmission bands 404, 502, 506, 510 of the reflective polarizer 102 may be chosen based on desired application attributes, such as the retardance characteristics of the half-wave retarder 104, emission properties of the display panel 108, and so forth.

Figure 10:
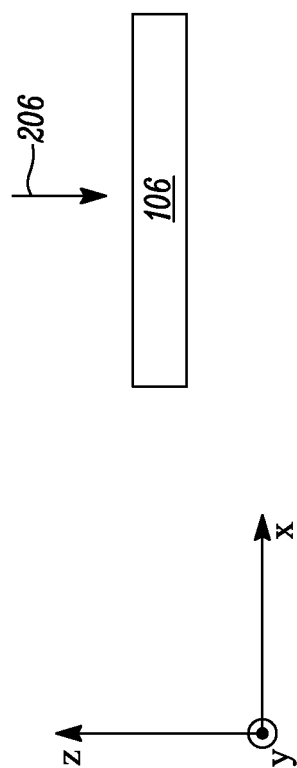
FIG. 10 is a schematic view of an absorbing polarizer of the optical stack according to one embodiment of the present disclosure.
Figure 11:
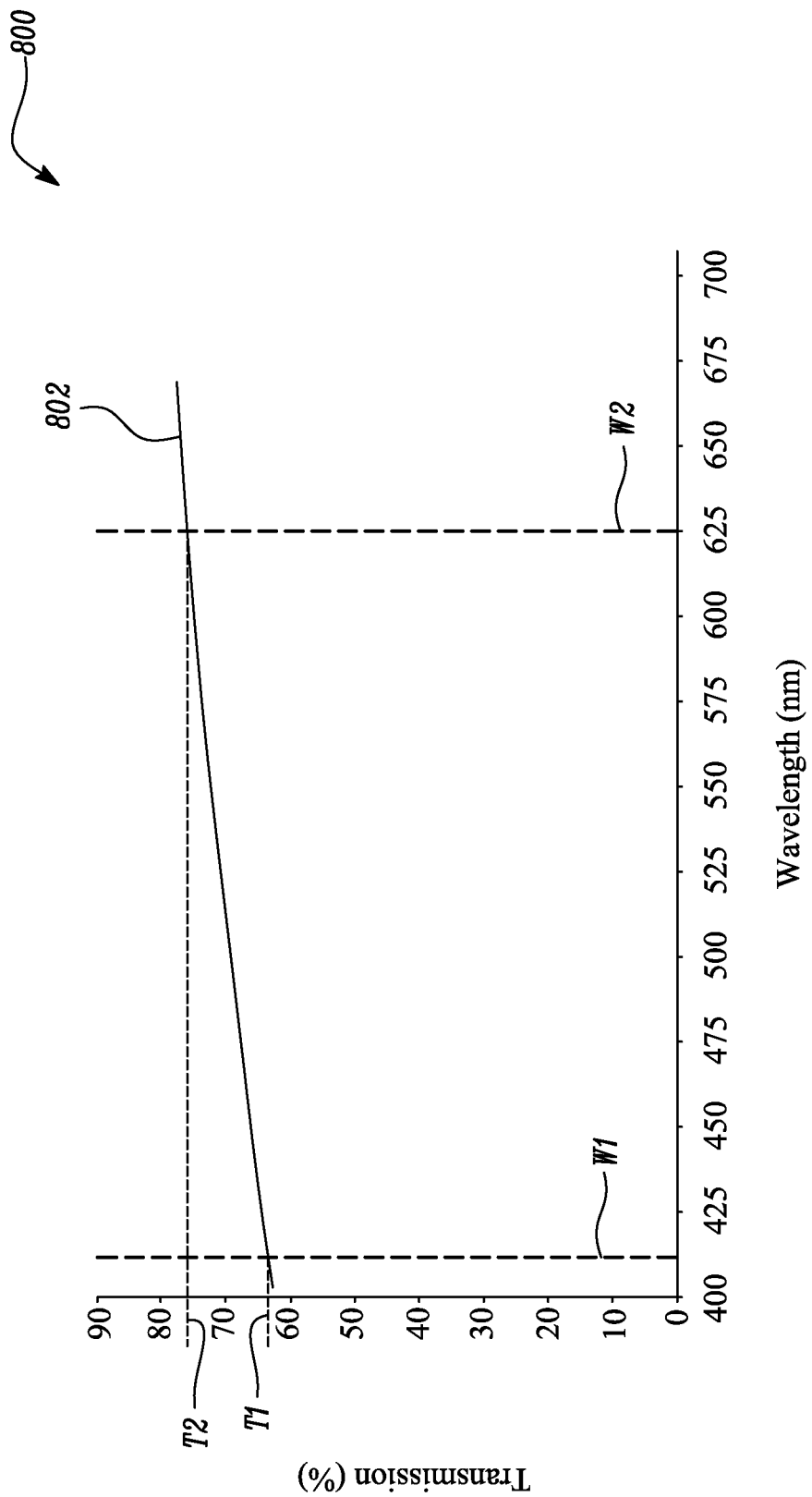
FIG. 11 is a graph illustrating transmission versus wavelength for the absorbing polarizer according to one embodiment of the present disclosure.

FIG. 10 illustrates the absorbing polarizer 106. FIG. 11 is a graph 800 illustrating transmission percentage versus wavelength for the absorbing polarizer 106. The graph 800 includes a transmission curve 802 which depicts transmission percentage of the absorbing polarizer 106 at various wavelengths. Referring to FIGS. 10 and 11, for substantially normally incident light 206 and the first polarization state, the absorbing polarizer 106 has a first transmittance T1 at the first wavelength W1 and a greater second transmittance T2 at the second wavelength W2. In some embodiments, for the first polarization state, the first transmittance T1 of the absorbing polarizer 106 is at least about 60%. In some embodiments, for the first polarization state, the first transmittance T1 of the absorbing polarizer 106 may be at least about 70%. In some embodiments, for the first polarization state, the second transmittance T2 of the absorbing polarizer 106 is at least about 65%. In some other embodiments, for the first polarization state, the second transmittance T2 of the absorbing polarizer 106 may be at least about 75%, at least about 80%, at least about 85%, or at least about 90%. In some embodiments, for the substantially normally incident light 206 and the second polarization state, the absorbing polarizer 106 may absorb at least 70% of the incident light 206 in the visible wavelength range.

The absorbing polarizer 106 may therefore transmit less light in the blue wavelength range as compared to other wavelengths. The absorbing polarizer 106 when combined with the reflective polarizer 102 and the half-wave retarder 104 in the optical stack 100 of FIGS. 1 and 2 may further reduce the color shifts.

Unless otherwise indicated, all numbers expressing feature sizes, amounts, and physical properties used in the specification and claims are to be understood as being modified by the term "about". Accordingly, unless indicated to the contrary, the numerical parameters set forth in the foregoing specification and attached claims are approximations that can vary depending upon the desired properties sought to be obtained by those skilled in the art utilizing the teachings disclosed herein.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. An optical stack comprising:
   a reflective polarizer comprising mutually orthogonal transmission and reflection axes;
   an absorbing polarizer; and
   a half-wave retarder disposed between the reflective and absorbing polarizers, such that for substantially normally incident light:

for a first polarization state, the reflective polarizer comprises a transmission band with a cut-off wavelength, wherein the reflective polarizer reflects at least about 60% of the incident light for at least a first wavelength less than the cut-off wavelength and transmits at least about 50% of the incident light for at least a second wavelength greater than the cut-off wavelength;

for an orthogonal second polarization state, the reflective polarizer transmits at least 70% of the incident light for each of the at least first and second wavelengths;

the half-wave retarder has a first retardance of less than about 250 nanometers (nm) at the first wavelength and a second retardance at the second wavelength, wherein a deviation of the first retardance from a first half-wave retardance corresponding to the first wavelength is less than a deviation of the second retardance from a second half-wave retardance corresponding to the second wavelength; and for the first polarization state, the absorbing polarizer has a first transmittance at the first wavelength and a greater second transmittance at the second wavelength.

2. The optical stack of claim 1, wherein the cut-off wavelength of the transmission band of the reflective polarizer is less than about 550 nm and greater than about 450 nm.

3. The optical stack of claim 1, wherein the reflective polarizer comprises a plurality of alternating first and second polymeric layers numbering at least 40 in total, each of the first and second polymeric layers having an average thickness of less than about 350 nm.

4. The optical stack of claim 1, wherein the second retardance is greater than about 200 nm, and wherein the first transmittance of the absorbing polarizer is at least about 60%.

5. The optical stack of claim 1, further comprising a display panel disposed below the reflective polarizer opposite to the half-wave retarder, the display panel configured to emit a display light including a blue emission spectra with a blue full width at half maxima (FWHM) defined between a minimum wavelength and a maximum wavelength, wherein the minimum wavelength is less than the cut-off wavelength of the transmission band of the reflective polarizer.

6. The optical stack of claim 5, wherein the cut-off wavelength of the transmission band of the reflective polarizer is less than the maximum wavelength of the blue FWHM.

7. The optical stack of claim 5, wherein the cut-off wavelength of the transmission band of the reflective polarizer is greater than the maximum wavelength of the blue FWHM.

8. An optical stack comprising:
a display panel configured to emit a display light including a blue emission spectra with a blue full width at half maxima (FWHM) defined between a minimum wavelength and a maximum wavelength;
a reflective polarizer configured to receive and reflect a portion of the display light from the display panel as a reflected polarized light, the reflective polarizer comprising mutually orthogonal transmission and reflection axes;
an absorbing polarizer;
a half-wave retarder disposed between the reflective and absorbing polarizers, such that for substantially normally incident light;
for a first polarization state, the reflective polarizer comprises a transmission band with a cut-off wavelength greater than the minimum wavelength of the blue emission spectra of the display panel, wherein the reflective polarizer reflects at least about 60% of the incident light for at least a first wavelength less than the cut-off wavelength and transmits at least about 50% of the incident light for at least a second wavelength greater than the cut-off wavelength;
for an orthogonal second polarization state, the reflective polarizer transmits at least 70% of the incident light for each of the at least first and second wavelengths;
the half-wave retarder has a first retardance of less than about 250 nm at the first wavelength and a second retardance at the second wavelength, wherein a deviation of the first retardance from a first half-wave retardance corresponding to the first wavelength is less than a deviation of the second retardance from a second half-wave retardance corresponding to the second wavelength; and
for the first polarization state, the absorbing polarizer has a first transmittance at the first wavelength and a greater second transmittance at the second wavelength.

9. The optical stack of claim 8, wherein the minimum wavelength is greater than about 430 nm and the maximum wavelength is less than about 480 nm, and wherein the cut-off wavelength of the transmission band of the reflective polarizer is less than the maximum wavelength of the blue FWHM.

10. The optical stack of claim 8, wherein the cut-off wavelength of the transmission band of the reflective polarizer is greater than the maximum wavelength of the blue FWHM.

* * * * *